(12) United States Patent
Su et al.

(10) Patent No.: US 7,615,860 B2
(45) Date of Patent: Nov. 10, 2009

(54) RIGID-FLEX PRINTED CIRCUIT BOARD WITH WEAKENING STRUCTURE

(75) Inventors: Kuo-Fu Su, Taoyuan (TW); Chih-Heng Chuo, Taoyuan (TW); Gwun-Jin Lin, Taoyuan (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 333 days.

(21) Appl. No.: 11/785,601

(22) Filed: Apr. 19, 2007

(65) Prior Publication Data
US 2008/0257587 A1 Oct. 23, 2008

(51) Int. Cl.
*H01L 23/14* (2006.01)
*H01L 23/12* (2006.01)

(52) U.S. Cl. ............... 257/702; 257/701; 257/E23.065; 361/749; 174/254

(58) Field of Classification Search ................. 257/701, 257/702, E23.065; 361/749; 174/254
See application file for complete search history.

(56) References Cited

U.S. PATENT DOCUMENTS

| | | | | |
|---|---|---|---|---|
| 5,100,492 A | * | 3/1992 | Kober et al. | 156/250 |
| 5,461,202 A | * | 10/1995 | Sera et al. | 174/254 |
| 6,373,709 B1 | * | 4/2002 | Hino et al. | 361/749 |
| 6,477,052 B1 | * | 11/2002 | Barcley | 361/719 |
| 6,486,408 B1 | * | 11/2002 | Morris | 174/254 |
| 2001/0003049 A1 | * | 6/2001 | Fukasawa et al. | 438/127 |
| 2004/0071052 A1 | * | 4/2004 | Hanaoka et al. | 369/44.14 |
| 2004/0112632 A1 | * | 6/2004 | Michiwaki et al. | 174/254 |
| 2006/0044749 A1 | * | 3/2006 | Pauley et al. | 361/685 |
| 2006/0169485 A1 | * | 8/2006 | Kawaguchi et al. | 174/254 |

\* cited by examiner

*Primary Examiner*—Nitin Parekh
(74) *Attorney, Agent, or Firm*—Rosenberg, Klein & Lee (57) ABSTRACT

A rigid-flex PCB includes at least one rigid PCB (RPCB) and at least one flexible PCB (FPCB). Each RPCB has a connection section; first and second sections separately extended from two lateral edges of the connection section and having at least one FPCB bonding side each; and a weakening structure formed along each joint of the connection section and the first and second sections. Each FPCB has a bending section corresponding to the connection section on the RPCB; first and second sections separately extended from two lateral edges of the bending section and having at least one RPCB bonding side each corresponding to the FPCB bonding sides of the first and second sections of the RPCB. When a proper pressure is applied against the weakening structures, the RPCB may be easily bent broken at the weakening structures to remove the connection section therefrom.

7 Claims, 9 Drawing Sheets

RIGID-FLEX PRINTED CIRCUIT BOARD WITH WEAKENING STRUCTURE

FIELD OF THE INVENTION

The present invention relates to a rigid-flex printed circuit board (PCB), and more particularly to a rigid-flex PCB with weakening structure.

BACKGROUND OF THE INVENTION

A printed circuit board (PCB) plays a very important role in many high-tech electronic products related to information industry. The conventional flat cable arrangement in PCB has been gradually replaced by a flexible printed circuit board (FPCB), the development of which has largely upgraded the technical level of electronic industry. FPCB includes a flexible substrate formed of copper foil, which is processed to directly arrange circuits thereon. The electronic and information industries also keep researching and developing circuit capacity that enables electric and electronic products to have small volume and reduced weight, and electronic components to be highly densely arranged on a circuit board. For this purpose, there are developed multilayer PCBs with multiple layers of rigid circuit boards (FPCBs) and flexible circuit boards (FPCBs), so as to increase the area on the circuit board for arranging circuits. Many advanced electronic products, such as mobile phones, notebook computers, and GPS (global positioning system) navigation systems, have adopted the multilayer circuit board technique.

While the multilayer circuit board has combined multiple layers of RPCBs and FPCBs to increase the area for arranging circuits, circuit arrangement at some bent areas still requires flexible cables. Even in some advanced wiring techniques, flexible cables are used along with RPCBs to achieve connection of two rigid circuit boards at bent portion.

Generally, the conventional PCB may be formed in two ways, namely, milling and stamping. In forming the PCB with stamping dies, a raw material for the circuit board is stamped independently, unnecessary leftovers are trimmed off, and the circuit board is removed from the stamped material by bending broken connecting points formed on the material. The leftovers produced during the forming of the circuit board would cause environmental pollution and waste of material.

The conventional circuit board requires precision manufacturing technique, and the FPCB thereof tends to crimp and produce surface folds when it is pressed and bonded to the FPCB. It also requires high precision technique to directly arrange circuits on the FPCB. Poor control in the manufacturing process would endanger the circuits on the FPCB or even destroy the whole FPCB. When the circuit board has all four edges remove therefrom, it does not provide any point of strength for supporting it, and the conventional microgroove V-cut processing technique can only be used to process the circuit board with limit to its operating direction.

SUMMARY OF THE INVENTION

It is therefore a primary object of the present invention to provide a rigid-flex PCB with weakening structure. The weakening structure includes at least one groove formed on the RPCB of the rigid-flex PCB and having a predetermined depth without completely cut the RPCB apart. The RPCB may be easily bent broken along the weakening structure when a proper pressure is applied against the weakening structure, allowing easy removal of a part of the RPCB therefrom and accordingly, bending of the whole rigid-flex PCB thereat.

Another object of the present invention is to provide a rigid-flex PCB that is provided at desired positions on at least one RPCB thereof with weakening structures, so that the RPCB may be easily bent broken along the weakening structures to facilitate easy manufacture of the rigid-flex PCB.

A further object of the present invention is to provide a weakening structure that may be easily formed on a rigid-flex PCB without the need of precision alignment technique or cutting dies for stamping the PCB, and is not limited to any particular forming direction.

The weakening structure may be formed on the RPCB before it is attached to the FPCB to form the rigid-flex PCB. With the weakening structure provided on the RPCB, circuits may be more easily and accurately arranged on the rigid-flex PCB as compared with the forming of circuits on a conventional flexible circuit board. The weakening structure can be formed without the need of precision tool, and can be provided at different positions depending on actual needs. By applying a minor pressure against the weakening structure, the RPCB may be easily bent broken at the weakening structure to remove part of the RPCB therefrom to facilitate easy arrangement of circuits on the rigid-flex PCB.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
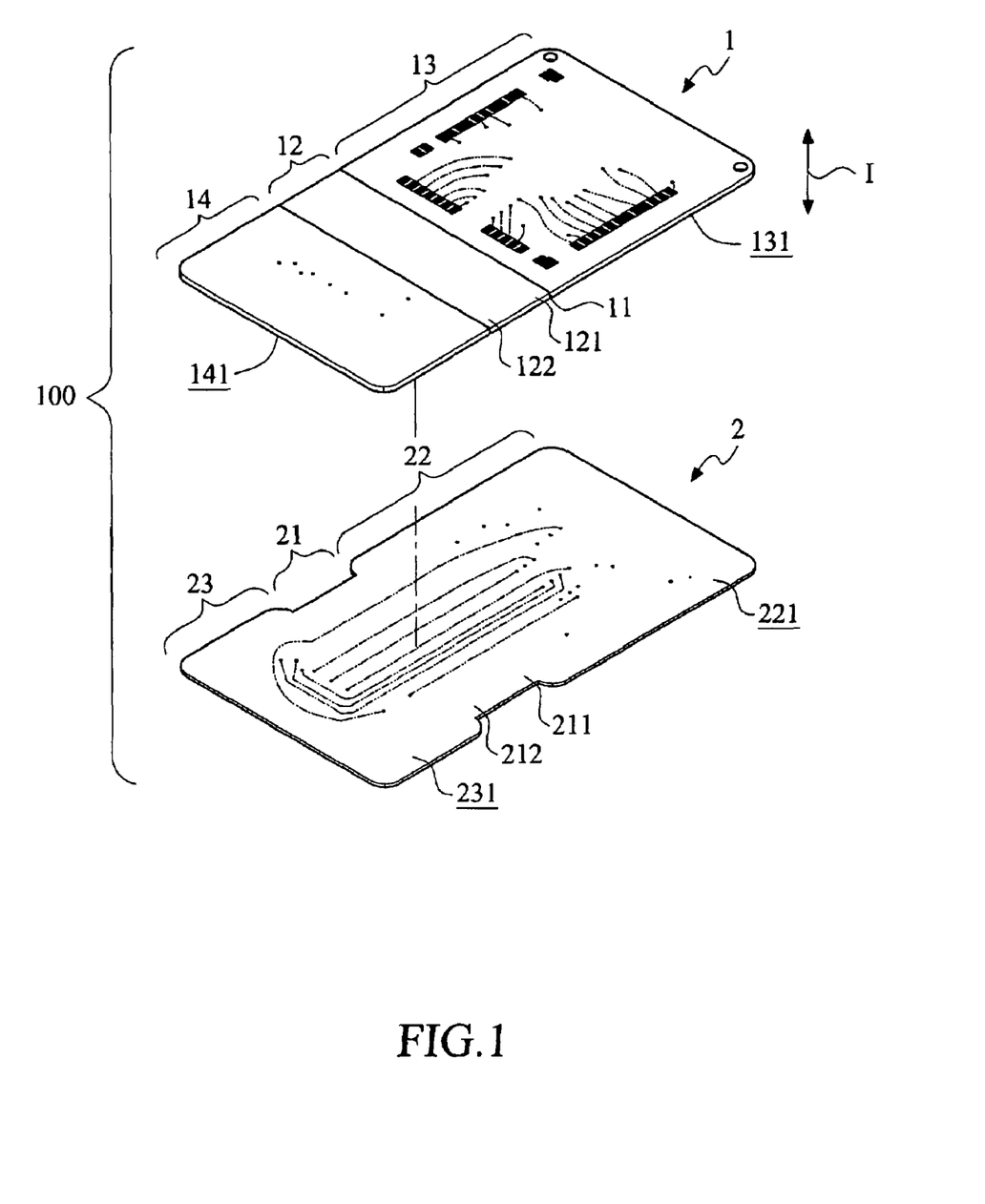
FIG. 1 is an exploded perspective view of a rigid-flex PCB with weakening structure according to a first embodiment of the present invention.
Figure 2:
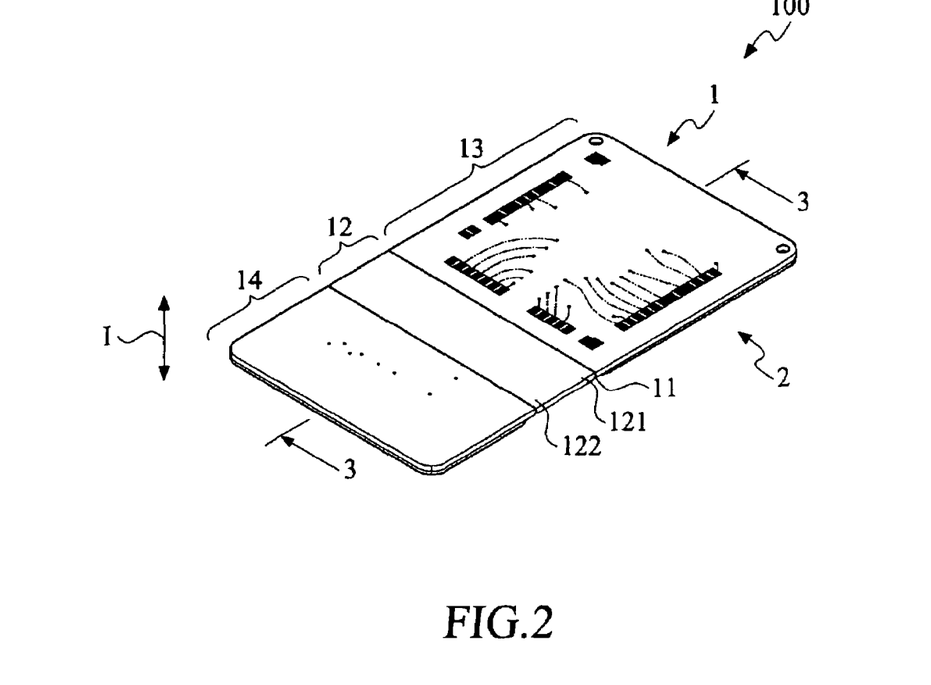
FIG. 2 is an assembled view of FIG. 1.
Figure 3:
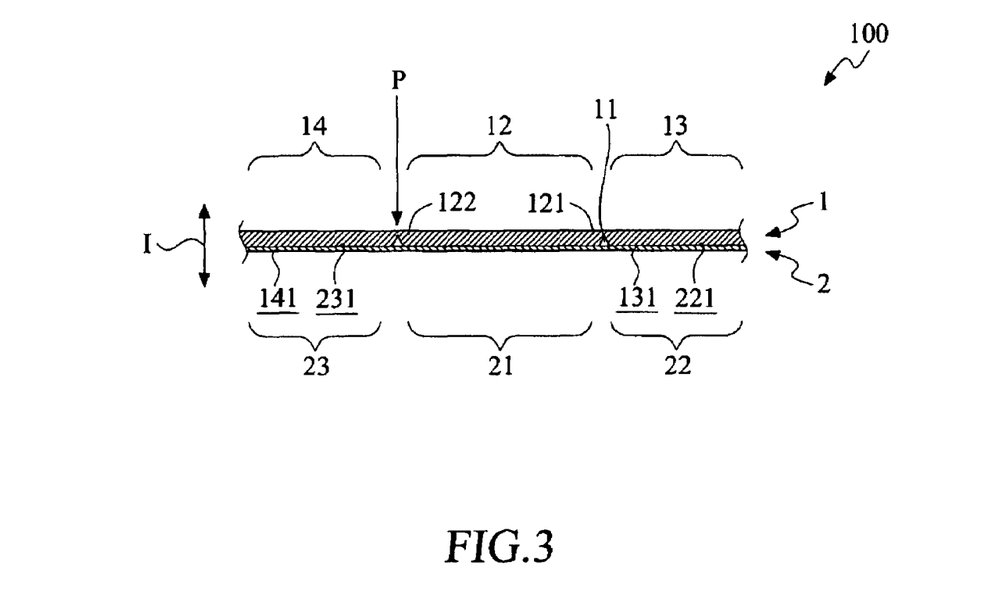
FIG. 3 is a sectional view taken along line 3-3 of FIG. 2.

Please refer to FIGS. 1 to 3, in which a rigid-flex printed circuit board (PCB) with weakening structure 100 according to a first embodiment of the present invention is shown. For the purpose of conciseness, the rigid-flex PCBs with weakening structure according to different embodiments of the present invention are also briefly referred to as the rigid-flex PCB herein.

As can be seen from FIGS. 1 to 3, the rigid-flex PCB 100 includes a rigid printed circuit board (RPCB) 1 and a flexible printed circuit board (FPCB) 2. The RPCB 1 includes a connection section 12 having a first lateral edge 121 and an opposite second lateral edge 122, a first section 13 extended from the first lateral edge 121 of the connection section 12 and having a FPCB bonding side 131, and a second section 14 extended from the second lateral edge 122 of the connection section 12 and having a FPCB bonding side 141. A first weakening structure 11 is formed on the RPCB 1 at the FPCB bonding side 131 along a joint of the connection section 12 and the first section 13 by upward cutting in a direction I perpendicular to the FPCB bonding side 131. And, a second weakening structure 11 is formed on the RPCB 1 at the FPCB bonding side 141 along a joint of the connection section 12 and the second section 14 by upward cutting in a direction I perpendicular to the FPCB bonding side 141.

The two weakening structures 11 may be two grooves having a predetermined depth and extended from an end to the other opposite end of the connection section 12. Preferably, the grooves forming the two weakening structures 11 have a vertical depth about two thirds (⅔) of a thickness of the RPCB 1. That is, the grooves do not upward cut the RPCB 1 apart. However, it is understood the grooves forming the weakening structures 11 may also have a depth equal to the thickness of the RPCB 1 and thereby upward cut the RPCB 1 apart, so that the connection section 12 is not connected to the first and the second section 13, 14.

The grooves forming the weakening structures 11 may be obtained by laser cutting to have a V-section, such that when a proper pressure P is applied against the RPCB 1 at the V-sectioned grooves 11, the connection section 12 may be easily separated from the first and the second section 13, 14. Similarly, the V-sectioned grooves 11 may have a vertical depth equal to or smaller than the thickness of the RPCB 1. Alternatively, the weakening structures 11 may be obtained by destroying a portion of the structure of the RPCB 1 along the joints of the connection section 12 and the first and the second section 13, 14 using supersonic cutting technique. In this manner, there would not be any externally visible grooves on the RPCB 1, while the RPCB 1 may still be easily bent broken at the weakening structures 11 by a proper pressure P applied thereto, allowing the connection section 12 to be separated therefrom.

The FPCB 2 includes a bending section 21 corresponding to the connection section 12 of the RPCB 1 and having a first lateral edge 211 and an opposite second lateral edge 212; a first section 22 extended from the first lateral edge 211 of the bending section 21 and having a RPCB bonding side 221 corresponding to the FPCB bonding side 131 of the first section 13 of the RPCB 1; and a second section 23 extended from the second lateral edge 211 of the bending section 21 and having a RPCB bonding side 231 corresponding to the FPCB bonding side 141 of the second section 14 of the RPCB 1.

Figure 4:
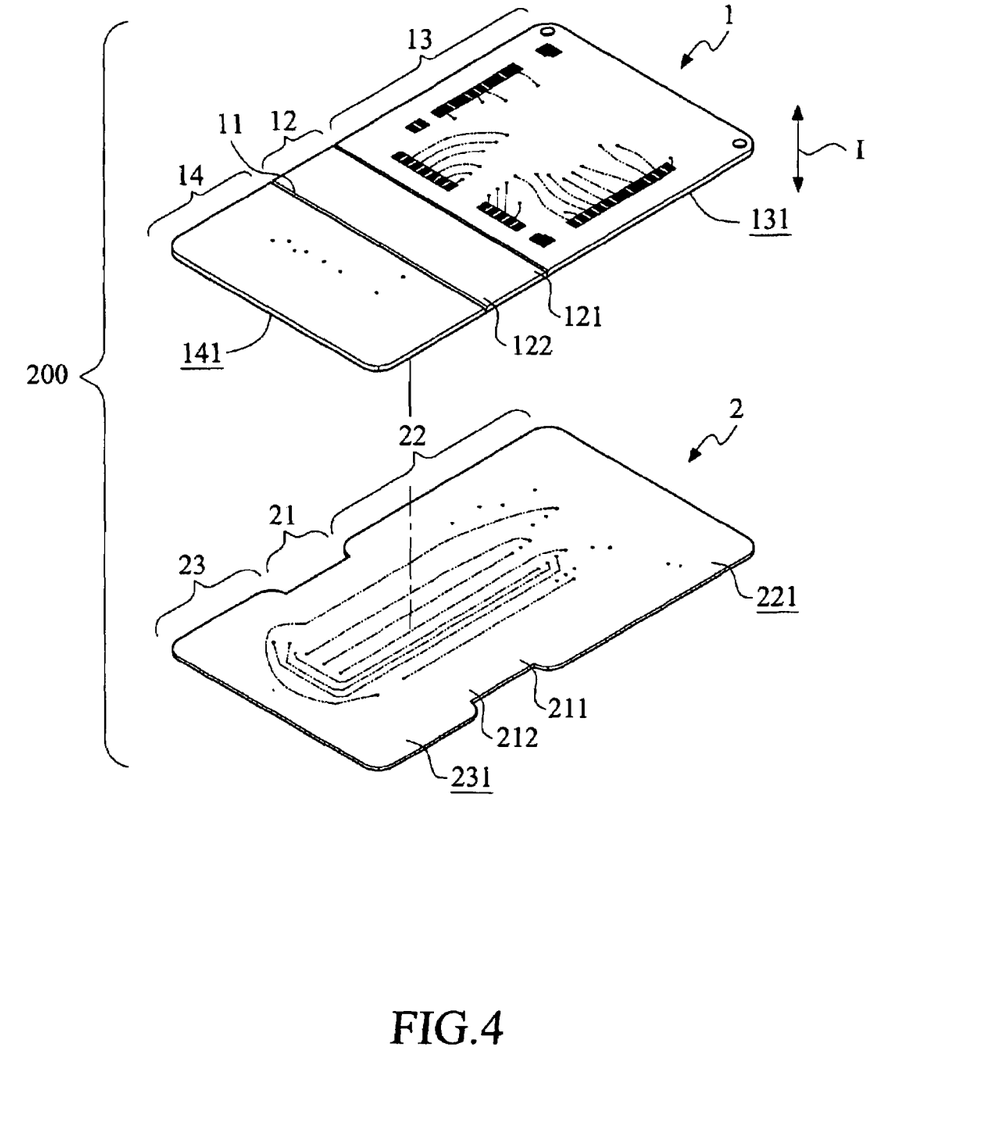
FIG. 4 is an exploded perspective view of a rigid-flex PCB with weakening structure according to a second embodiment of the present invention.
Figure 5:
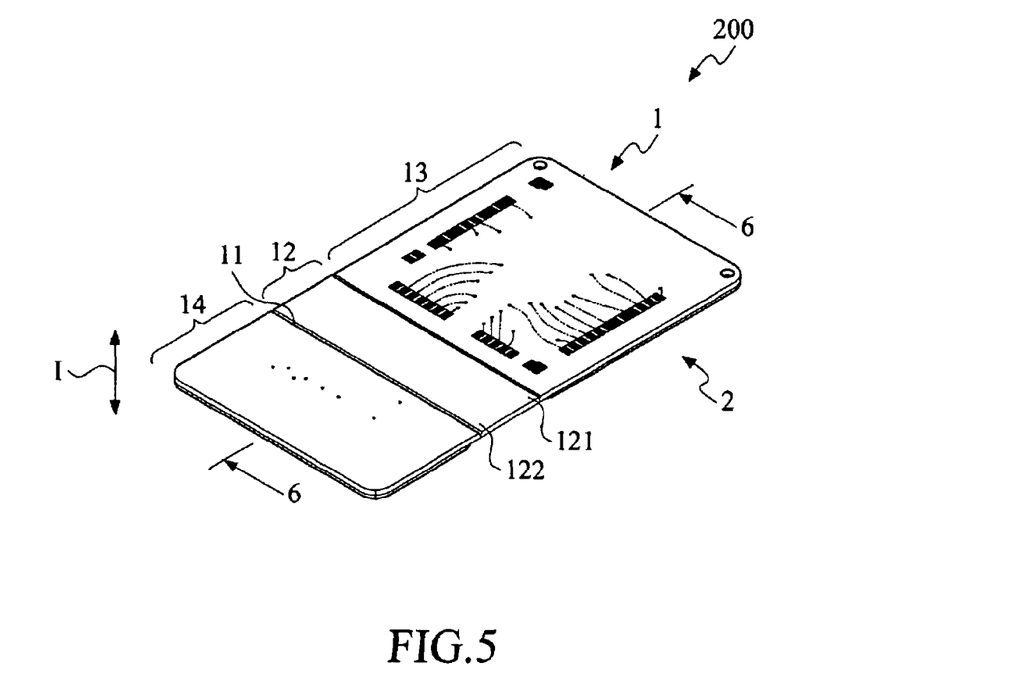
FIG. 5 is an assembled view of FIG. 4.
Figure 6:
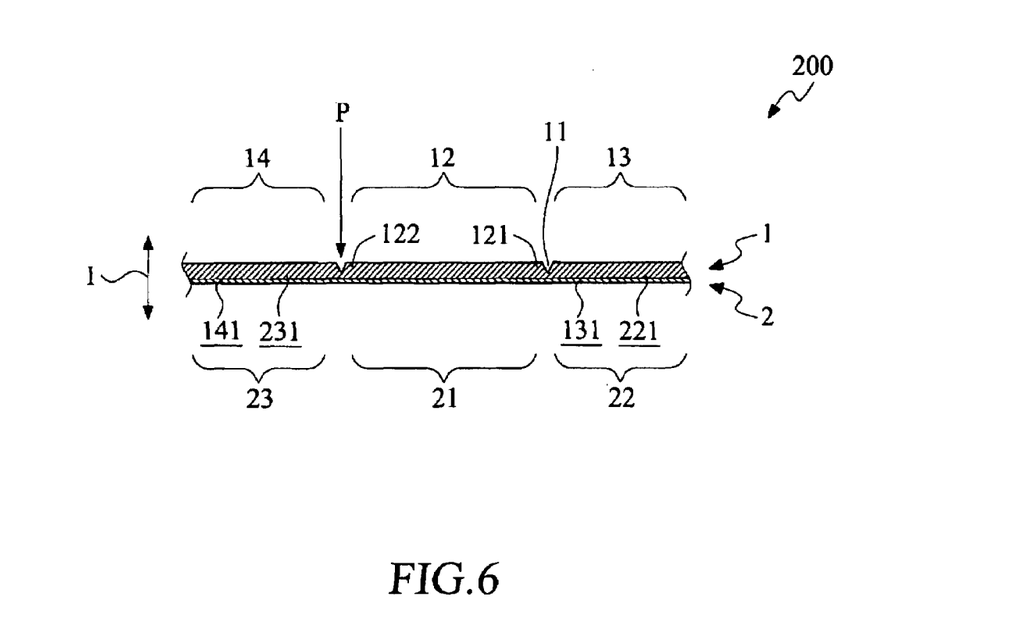
FIG. 6 is a sectional view taken along line 6-6 of FIG. 5.

Please refer to FIGS. 4 to 6, in which a rigid-flex PCB with weakening structure 200 according to a second embodiment of the present invention is shown. As in the first embodiment, the rigid-flex PCB 200 includes a RPCB 1 and a FPCB 2 that are structurally similar to that in the rigid-flex PCB 100 of the first embodiment. The second embodiment is different from the first embodiment in that the first weakening structure 11 is formed on the RPCB 1 at one side opposite to the FPCB bonding side 131 along the joint of the connection section 12 and the first section 13 by downward cutting in a direction I perpendicular to the FPCB bonding side 131. And, the second weakening structure 11 is formed on the RPCB 1 at one side opposite to the FPCB bonding side 141 along the joint of the connection section 12 and the second section 14 by downward cutting in a direction I perpendicular to the FPCB bonding side 141.

In the second embodiment, the two weakening structures 11 may be two grooves having a predetermined depth and extended from an end to the other opposite end of the connection section 12. Preferably, the two grooves forming the weakening structures 11 have a vertical depth about two thirds (⅔) of a thickness of the RPCB 1. That is, the grooves do not downward cut the RPCB 1 apart. However, it is understood the grooves forming the weakening structures 11 in the second embodiment may also have a depth equal to the thickness of the RPCB 1 and thereby downward cut the RPCB 1 apart, so that the connection section 12 is not connected to the first and the second section 13, 14.

Figure 7:
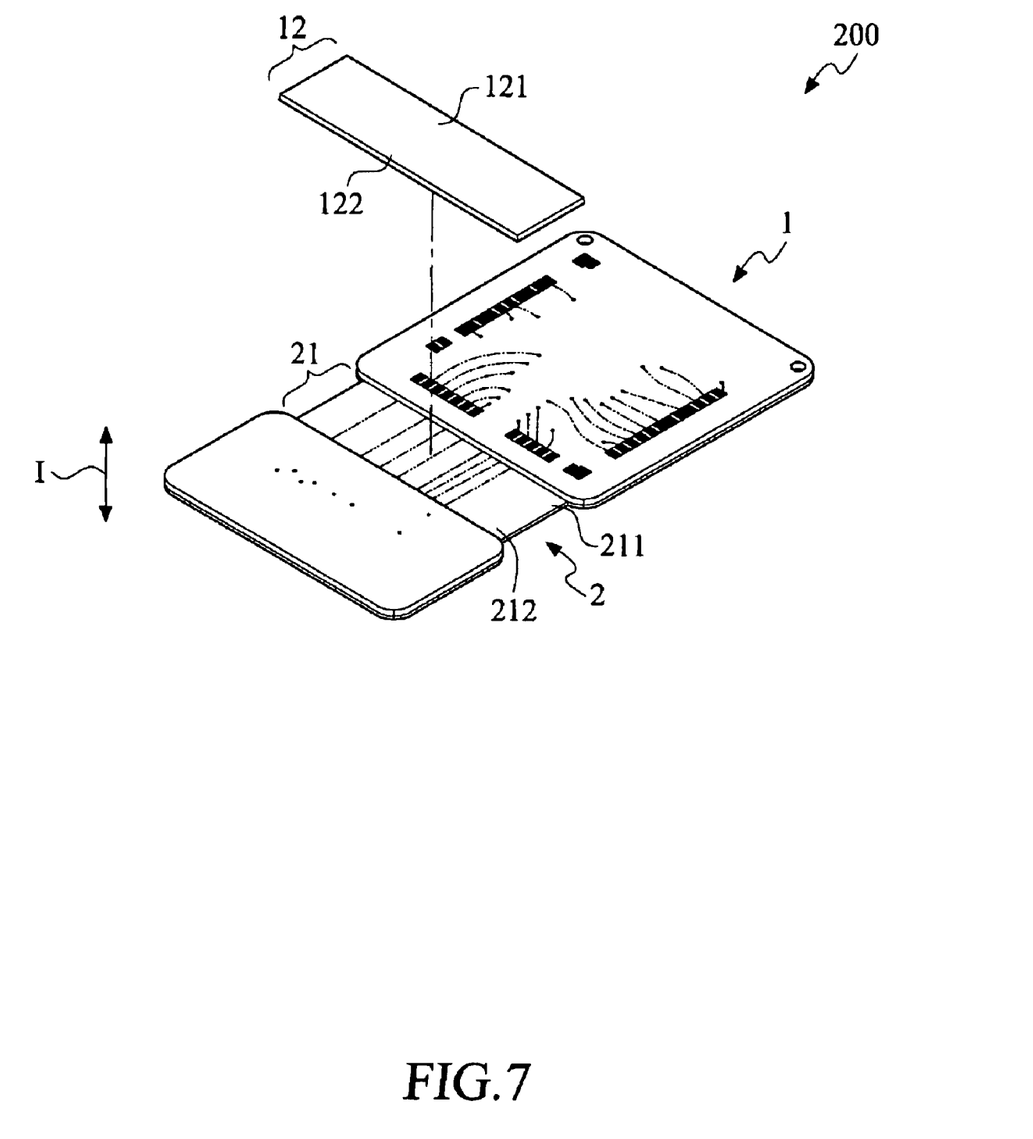
FIG. 7 shows the rigid-flex PCB with weakening structure according to the present invention with a connection section thereof removed therefrom.
Figure 8:
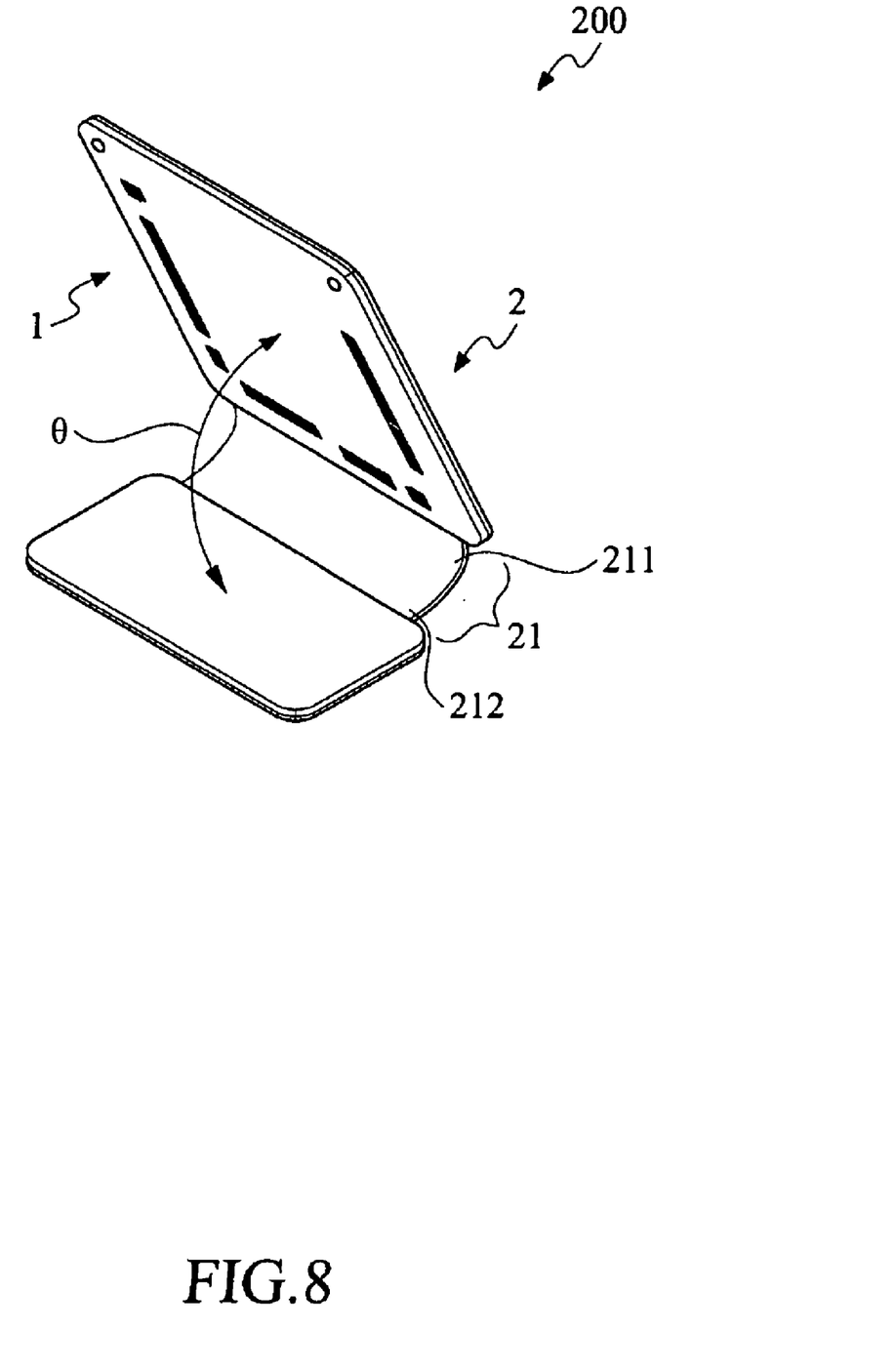
FIG. 8 shows the rigid-flex PCB with weakening structure of FIG. 7 is folded at a bending section thereof.

Please refer to FIGS. 7 and 8. When the RPCB 1 and the FPCB 2 are bonded to each other, the first and second sections 22, 23 of the FPCB 2 are located corresponding to the first and second sections 13, 14 of the RPCB 1, respectively. When a proper pressure is applied against the grooves forming the weakening structures 11, the RPCB 1 may be easily bent broken at the grooves, and the connection section 12 connected to the first and the second section 13, 14 may be easily separated from the RPCB 1 to expose the bending section 21 of the FPCB 2, which bridges the first section 13 with the second section 14 of the RPCB 1. The rigid-flex PCB of the present invention may be bent at the bending section 21 of the FPCB 2 by a predetermined angle θ, so that the first section 13 of the RPCB 1 is folded toward the second section 14 with a free edge of the first section 13 located in the vicinity of the second section 14.

Figure 9:
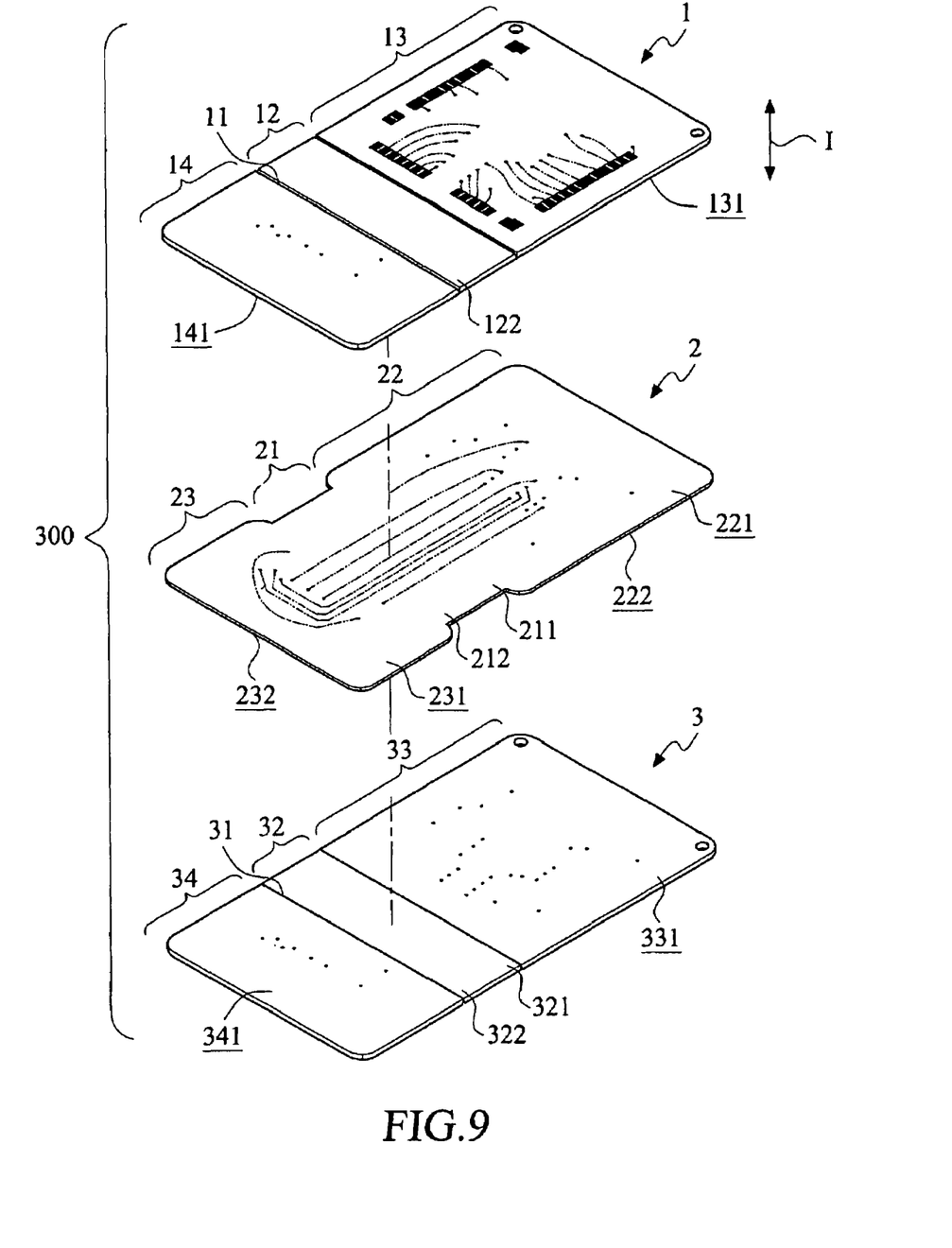
FIG. 9 is an exploded perspective view of a rigid-flex PCB with weakening structure according to a third embodiment of the present invention.
Figure 10:
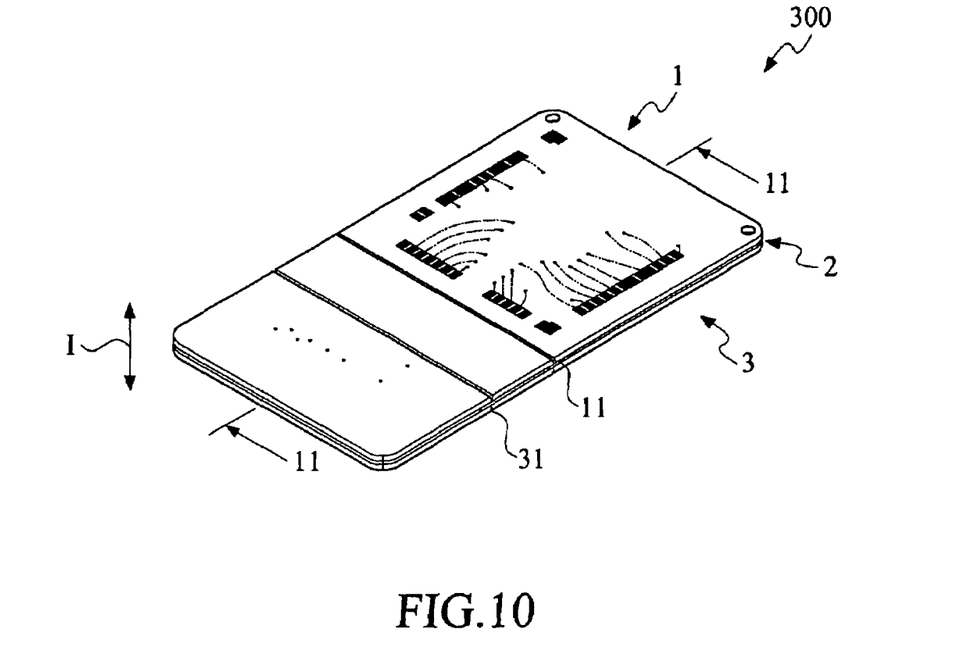
FIG. 10 is an assembled view of FIG. 9.
Figure 11:
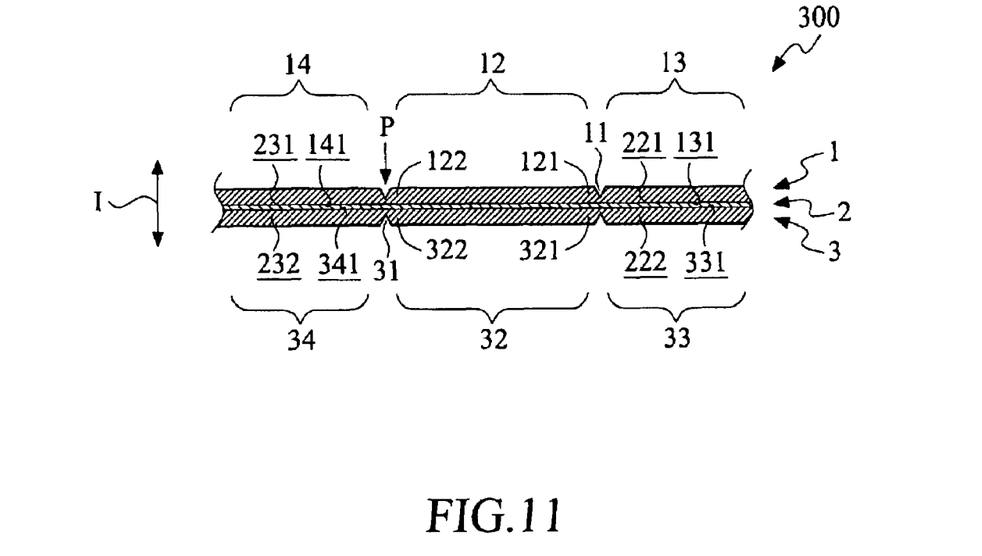
FIG. 11 is a sectional view taken along line 11-11 of FIG. 10.

Please refer to FIGS. 9 to 11, in which a rigid-flex PCB with weakening structure 300 according to a third embodiment of the present invention is shown. As shown, the rigid-flex PCB 300 includes a first RPCB 1, a FPCB 2 located below the first RPCB 1, and a second RPCB 3 located below the FPCB 2 opposite to the first RPCB 1. The first RPCB 1 and the FPCB 2 are generally similar to the RPCB 1 and the FPCB 2 in the second embodiment of the present invention, except that the first and the second section 22, 23 of the FPCB 2 respectively have upper and lower RPCB bonding sides 221, 222 and 231, 232.

The second RPCB 3 includes a connection section 32 having a first lateral edge 321 and an opposite second lateral edge 322, a first section 33 extended from the first lateral edge 321 of the connection section 32 and having a FPCB bonding side 331, and a second section 34 extended from the second lateral edge 322 of the connection section 32 and having a FPCB bonding side 341. A third weakening structure 31 is formed on the second RPCB 3 at one side opposite to the FPCB bonding side 331 along a joint of the connection section 32 and the first section 33 by upward cutting in a direction I perpendicular to the FPCB bonding side 331. And, a fourth weakening structure 31 is formed on the RPCB 1 at one side opposite to the FPCB bonding side 341 along a joint of the connection section 32 and the second section 34 by upward cutting in a direction I perpendicular to the FPCB bonding side 341.

Figure 12:
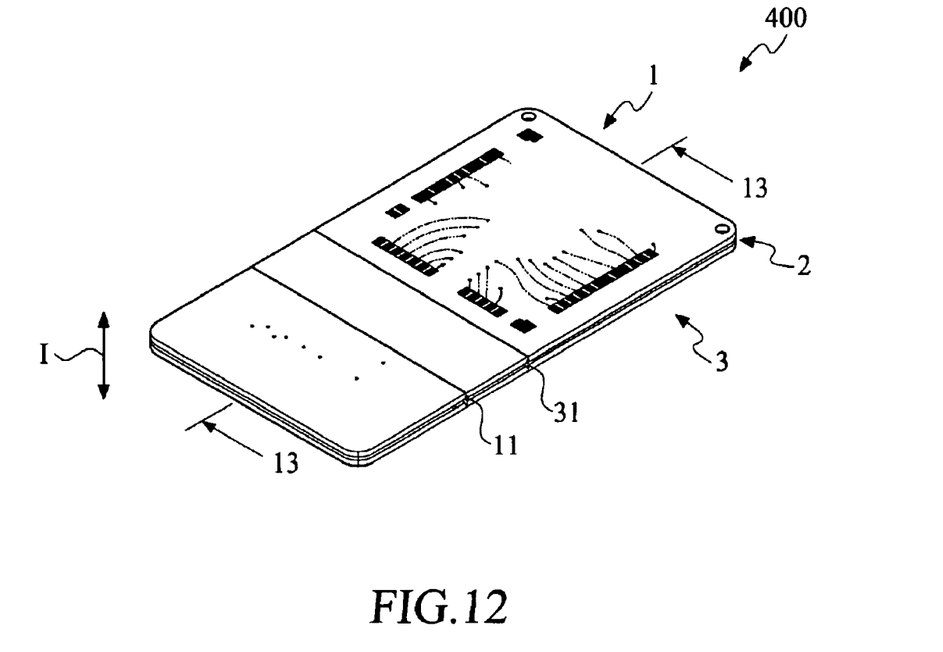
FIG. 12 is an assembled perspective view of a rigid-flex PCB with weakening structure according to a fourth embodiment of the present invention.
Figure 13:
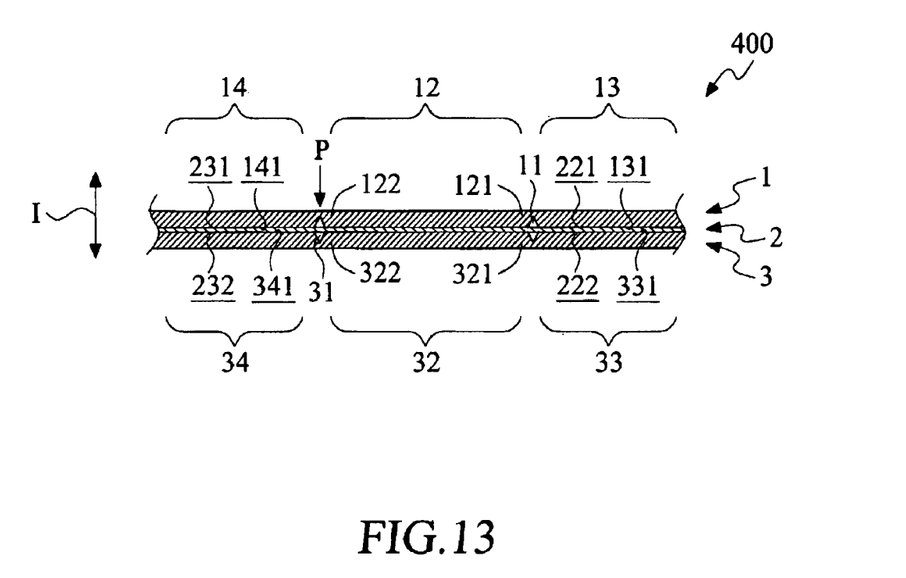
FIG. 13 is a sectional view taken along line 13-13 of FIG. 12.

FIGS. 12 and 13 show a rigid-flex PCB with weakening structure 400 according to a fourth embodiment of the present invention is shown. As shown, the rigid-flex PCB 400 includes a first RPCB 1, a FPCB 2 located below the first RPCB 1, and a second RPCB 3 located below the FPCB 2 opposite to the first RPCB 1. The first RPCB 1 and the FPCB 2 are generally similar to the RPCB 1 and the FPCB 2 in the first embodiment of the present invention, except that the first and the second section 22, 23 of the FPCB 2 respectively, have upper and lower RPCB bonding sides 221, 222, and 231, 232.

The first RPCB 1 includes a connection section 12 having a first lateral edge 121 and an opposite second lateral edge 122, a first section 13 extended from the first lateral edge 121 of the connection section 12 and having a FPCB bonding side 131, and a second section 14 extended from the second lateral edge 122 of the connection section 12 and having a FPCB bonding side 141. A first weakening structure 11 is formed on the RPCB 1 at the FPCB bonding side 131 along a joint of the connection section 12 and the first section 13 by upward cutting in a direction I perpendicular to the FPCB bonding side 131. And, a second weakening structure 11 is formed on the RPCB 1 at the FPCB bonding side 141 along a joint of the connection section 12 and the second section 14 by upward cutting in a direction I perpendicular to the FPCB bonding side 141.

The second RPCB 3 includes a connection section 32 having a first lateral edge 321 and an opposite second lateral edge 322, a first section 33 extended from the first lateral edge 321 of the connection section 32 and having a FPCB bonding side 331, and a second section 34 extended from the second lateral edge 322 of the connection section 32 and having a FPCB bonding side 341. A third weakening structure 31 is formed on the second RPCB 3 at the FPCB bonding side 331 along a joint of the connection section 32 and the first section 33 by downward cutting in a direction I perpendicular to the FPCB bonding side 331. And, a fourth weakening structure 31 is formed on the RPCB 3 at the FPCB bonding side 341 along a joint of the connection section 32 and the second section 34 by downward cutting in a direction I perpendicular to the FPCB bonding side 341.

After the first RPCB 1 is bonded to a top of the FPCB 2 as in the first embodiment, the second RPCB 3 is further bonded to an underside of the FPCB 2 opposite to the first RPCB 1, such that the lower RPCB bonding side 222 of the first section 22 of the FPCB 2 corresponds to the FPCB bonding side 331 of the first section 33 of the second RPCB 3, and the lower RPCB bonding side 232 of the second section 23 of the FPCB 2 corresponds to the FPCB bonding side 341 of the second section 34 of the second RPCB 3. When a proper pressure is applied against the weakening structures 11, 31, the connection sections 12, 32 may be easily separated from the first and the second RPCB 1 and 3, respectively, to expose the bending section 21 of the FPCB 2. The exposed bending section 21 bridges the first section 13, 33 with the second section 14, 34. Again, the rigid-flex PCB 400 may be bent at the bending section 21 of the FPCB 2 by an angle θ, so that the first sections 13, 33 of the first and the second RPCB 1, 3 are folded toward the second sections 14, 34 with free edges of the first sections 13, 33 located in the vicinity of the second sections 14, 34, similar to that shown in FIG. 8.

It is noted the two weakening structures 11 are not necessarily formed at the same side of the first RPCB 1, but may be flexibly formed at two opposite sides or even both sides of the first RPCB 1, depending on actual needs. Similarly, the two weakening structures 31 are not necessarily formed at the same side of the second RPCB 3, but may be flexibly formed at two opposite sides or even both sides of the second RPCB 3, depending on actual needs.

With the two RPCBs 1 and 3, the rigid-flex PCBs 300, 400 of the present invention may have increased overall thickness and increased area for circuit arrangements. Preferably, the numbers of the RPCBs 1, 3 and the FPCBs 2 to be included in the rigid-flex PCB may be determined according to actual design requirement. The RPCBs 1, 3 may be formed with more than two weakening structures 11, 31 before they are bonded to the FPCB 2. Alternatively, more than two RPCBs 1, 3 may be formed with more than two weakening structures 11, 31 before they are bonded to two or more FPCBs 2.

What is claimed is:

1. A rigid-flex printed circuit board (PCB) with a weakening structure, comprising a rigid printed circuit board (RPCB) and a flexible printed circuit board (FPCB) that are bonded together form a complete circuit board;
    the RPCB including:
    a connection section having a first lateral edge and an opposite second lateral edge;
    a first section extended from the first lateral edge of the connection section with a weakening structure formed between the first section and the connection section, and having a FPCB bonding side, the weakening structure including a groove extending entirely from an end to an opposing end of the connection section; and
    a second section extended from the second lateral edge of the connection section with a weakening structure formed between the second section and the connection section, and having a FPCB bonding side; and
    the FPCB including:
    a bending section corresponding to the connection section on the RPCB, and having a first lateral edge and an opposite second lateral edge;
    a first section extended from the first lateral edge of the bending section, and having a RPCB bonding side corresponding to the FPCB bonding side of the first section of the RPCB; and
    a second section extended from the second lateral edge of the bending section, and having a RPCB bonding side corresponding to the FPCB bonding side of the second section of the RPCB.

2. The rigid-flex PCB with a weakening structure as claimed in claim 1, wherein the weakening structures are formed on the RPCB at one side opposite to the FPCB bonding side by a cut in a direction perpendicular to a top surface of the RPCB to produce grooves having a predetermined vertical depth and extended entirely from an end to the other opposite end of the connection section.

3. The rigid-flex PCB with a weakening structure as claimed in claim 1, wherein the bending section of the FPCB is bendable by a predetermined angle to fold the first section of the RPCB toward the second section of the RPCB.

4. A rigid-flex printed circuit board (PCB) with a weakening structure, comprising at least one rigid printed circuit board (RPCB) and at least one flexible printed circuit board (FPCB) that together form a complete circuit board;
    the at least one RPCB including:
    a connection section having a first lateral edge and an opposite second lateral edge;
    a first section extended from the first lateral edge of the connection section with a weakening structure formed between the first section and the connection section, and having at least one FPCB bonding side, the weakening structure including a groove extending entirely from an end to an opposing end of the connection section; and
    a second section extended from the second lateral edge of the connection section with a weakening structure formed between the second section and the connection section, and having at least one FPCB bonding side; and
    the at least one FPCB including: a bending section corresponding to the connection section on the at least one RPCB, and having a first lateral edge and an opposite second lateral edge;

a first section extended from the first lateral edge of the bending section, and having at least one RPCB bonding side corresponding to the at least one FPCB bonding side of the first section of the at least one RPCB; and a second section extended from the second lateral edge of the bending section, and having at least one RPCB bonding side corresponding to the at least one FPCB bonding side of the second section of the at least one RPCB.

5. The rigid-flex PCB with a weakening structure as claimed in claim 4, wherein the weakening structures are formed on the at least one RPCB at one side opposite to the at least one FPCB bonding side by a cut in a direction perpendicular to a top surface of the at least one RPCB to produce grooves having a predetermined vertical depth and extended entirely from an end to an opposite end of the connection section.

6. The rigid-flex PCB with a weakening structure as claimed in claim 4, wherein the weakening structures are formed on the at least one RPCB at the at least one FPCB bonding side by a cut in a direction perpendicular to a top surface of the at least one RPCB to produce grooves having a predetermined vertical depth and extended entirely from an end to an opposite end of the connection section.

7. The rigid-flex PCB with a weakening structure as claimed in claim 4, wherein the bending section of the at least one FPCB is bendable by a predetermined angle to fold the first section of the at least one RPCB toward the second section of the at least one RPCB.

* * * * *